(12) United States Patent
Loy et al.

(10) Patent No.: US 12,349,608 B2
(45) Date of Patent: Jul. 1, 2025

(54) MEMORY DEVICES AND METHODS OF MAKING THE SAME

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundaries Singapore Pte. Ltd., Singapore (SG)

( * ) Notice: Subject to any disclaimer, the term of this patent is extended or adjusted under 35 U.S.C. 154(b) by 412 days.

(21) Appl. No.: 17/411,032

(22) Filed: Aug. 24, 2021

(65) Prior Publication Data
US 2023/0065317 A1    Mar. 2, 2023

(51) Int. Cl.
*H10N 70/00* (2023.01)

(52) U.S. Cl.
CPC ......... *H10N 70/828* (2023.02); *H10N 70/011* (2023.02); *H10N 70/823* (2023.02); *H10N 70/841* (2023.02)

(58) Field of Classification Search
CPC .................................................. H10N 70/823
See application file for complete search history.

(56) References Cited

U.S. PATENT DOCUMENTS

| | | | |
|---|---|---|---|
| 9,564,587 B1 * | 2/2017 | Jo | H10N 70/011 |
| 2014/0091273 A1 * | 4/2014 | Lin | G11C 13/0007 257/E45.001 |
| 2020/0411593 A1 * | 12/2020 | Jang | H10N 70/231 |
| 2022/0093857 A1 * | 3/2022 | Sung | H10N 70/20 |

OTHER PUBLICATIONS

U.S. Appl. No. 15/931,607, Hsieh et al.
U.S. Appl. No. 17/357,905, Loy et al.
Yi-Jen Huang et al., Low-power resistive random access memory by confining the formation of conducting filaments, AIP Advances, 2016, pp. 065022-1-065022-6, vol. 6, AIP Publishing.
Han-Hyeong Choi et al., Tip-enhanced electric field-driven efficient charge injection and transport in organic material-based resistive memories, Applied Materials Today, 2020, pp. 1-8, vol. 20—Issue No. 100746, Elsevier.
Gang Niu et al., Geometric conductive filament confinement by nanotips for resistive switching of HfO2-RRAM devices with high performance, Scientific Reports, 2016, pp. 1-9, vol. 6—Issue No. 25757, Nature Research.
Muxi Yu et al., Novel Vertical 3D Structure of TaOx-based RRAM with Self-localized Switching Region by Sidewall Electrode Oxidation, Scientific Reports, 2016, pp. 1-10, vol. 6—Issue No. 21020, Nature Research.

* cited by examiner

*Primary Examiner* — Ajay Ojha
*Assistant Examiner* — Hajar Kolahdouzan
(74) *Attorney, Agent, or Firm* — David Cain

(57) ABSTRACT

The disclosed subject matter relates generally to structures, memory devices and a method of forming the same. More particularly, the present disclosure relates to resistive random-access (ReRAM) memory devices having a spacer element on a side of the electrode. The present disclosure provides a memory device including a first electrode having a side, the side has upper and lower portions, a spacer element on the lower portion of the side of the first electrode, a resistive layer on the upper portion of the side of the first electrode, and a second electrode laterally adjacent to the side of the first electrode. The second electrode has a top surface, in which the top surface has a concave profile.

19 Claims, 7 Drawing Sheets

MEMORY DEVICES AND METHODS OF MAKING THE SAME

FIELD OF THE INVENTION

The disclosed subject matter relates generally to memory devices and a method of forming the same. More particularly, the present disclosure relates to resistive random-access (ReRAM) memory devices having a spacer element on a side of the electrode.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high resistance state (HRS), which may be representative of an off or '0' state; and a low resistance state (LRS), which may be representative of an on or '1' state. However, these devices may experience large variations in resistive switching characteristics and may cause large fluctuations of current flow within the device, which decreases the performance of the device and increases its power consumption.

SUMMARY

In an aspect of the present disclosure, there is provided a memory device including a first electrode having a side, the side has upper and lower portions, a spacer element on the lower portion of the side of the first electrode, a resistive layer on the upper portion of the side of the first electrode, and a second electrode laterally adjacent to the side of the first electrode. The second electrode has a top surface, in which the top surface has a concave profile.

In yet another aspect of the present disclosure, there is provided a method of forming a memory device by forming a first electrode having a side with upper and lower portions, the first electrode being formed above an inter-metal dielectric region, forming a spacer element on the lower portion of the side of the first electrode, forming a resistive layer on the upper portion of the side of the first electrode, and forming a second electrode laterally adjacent to the side of the first electrode. The second electrode has a top surface, in which the top surface has a concave profile.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
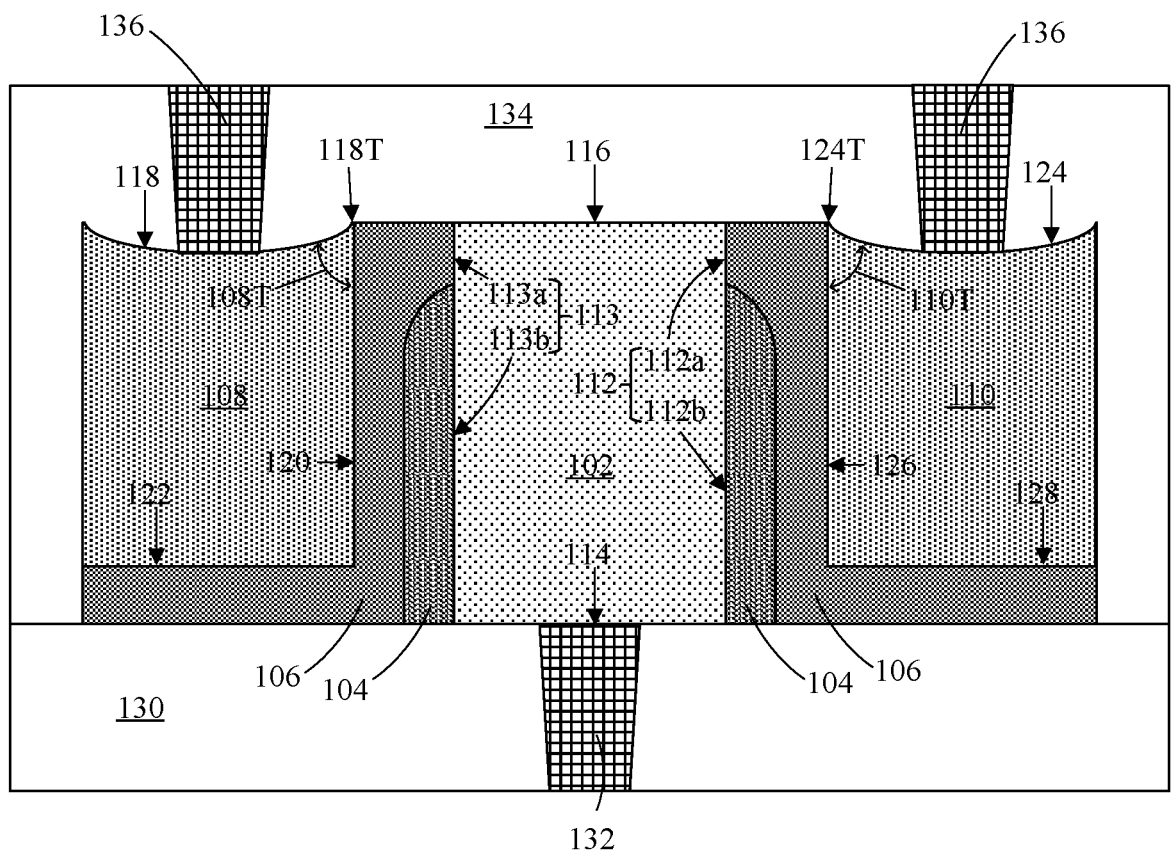
FIG. 1 is a cross-sectional view of an exemplary memory device.

Referring to FIG. 1, an example of a memory device disclosed herein includes a first electrode 102 having at least one side. As shown, the first electrode 102 may have a first side 112 and a second side 113. The first side 112 has an upper portion (hereinafter referred to as "upper side portion" 112a) and a lower portion (hereinafter referred to as "lower side portion" 112b). The second side 113 has an upper portion (hereinafter referred to as "upper side portion" 113a) and a lower portion (hereinafter referred to as "lower side portion" 113b). The first electrode 102 may also have a top surface 116 and a bottom surface 114. Although not shown, in an embodiment, the first electrode 102 may have a cylindrical geometry. The top surface of the first electrode 102 may have an elliptical (e.g., circular or oval) shape. In another embodiment, the top surface of the first electrode 102 may have a polygonal (e.g., rectangular, pentagonal, hexagonal, heptagonal, octagonal, nonagonal, decagonal, etc.) shape. In embodiments where the top surface 116 of the first electrode 102 has a polygonal shape, the first side 112 may be opposite to the second side 113. For example, if the top surface 116 has a rectangular shape, then the first side 112 may be oppositely facing the second side 113 such that the first side 112 may be substantially parallel to the second side 113.

The example memory device also includes a spacer element 104 disposed on the lower side portions 112b, 113b of the first electrode 102. The spacer element 104 may include a nitride or an oxide. Examples of a nitride may include, but are not limited to, silicon nitride, silicon oxynitride. Examples of an oxide may include, but are not limited to, silicon dioxide, tetraethyl orthosilicate (TEOS), or a material having a chemical composition of $SiC_xO_yH_z$, wherein x, y, and z are in stoichiometric ratio.

The example memory device also includes a resistive layer 106 disposed on the upper side portions 112a, 113a of the first electrode 102. Examples of the material for the resistive layer 106 may include, but are not limited to, carbon polymers, perovskites, silicon dioxide, metal oxides, or nitrides. Some examples of metal oxides may include lanthanide oxides, tungsten oxide, copper oxide, cobalt oxide, silver oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. The resistive layer 106 may have a thickness that is engineered such that a relatively low voltage level may be sufficient to switch the resistance states of the resistive layer 106. Preferably, the resistive layer 106 may have a thickness in the range of about 2 nm to about 10 nm, or particularly, a thickness of about 5 nm.

The example memory device also includes a second electrode 108 laterally adjacent to the side 113 of the first electrode 102. The second electrode 108 has a top surface 118, a side 120, and a bottom surface 122, The top surface 118 of the second electrode 108 has a concave profile. The side 120 of the second electrode 108 may form an acute angle 108T with the concave top surface 118 of the second electrode 108. The side 120 of the second electrode 108 may also meet the top surface 118 to provide a top edge 118T.

The example memory device may further include a third electrode 110 laterally adjacent to the side 112 of the first electrode 102. As shown, the first electrode 102 may be positioned laterally between the third electrode 110 and the second electrode 106. The third electrode 110 has a top surface 124, a side 126, and a bottom surface 128. The top surface 124 of the third electrode 110 has a concave profile. The side 126 of the third electrode 110 may form an acute angle 110T with the concave top surface 124 of the third electrode 110. The side 126 of the third electrode 110 may also meet the top surface 124 to provide a top edge 124T.

The spacer element 104 and the resistive layer 106 may be positioned between the first electrode 102 and the second electrode 108. The spacer element 104 and the resistive layer 106 may additionally lie between the first electrode 102 and the third electrode 110. The resistive layer 106 may contact or directly contact the upper side portions 112a, 113a of the first electrode 102. The top surface 116 of the first electrode 102 may have a substantially planar profile, and may be uncovered by the resistive layer 106. The resistive layer 106 may be configured to have a switchable resistance in response to a change in an electric signal. The resistive layer 106 may include a conductive path configured to form between the upper side portion 113a of the first electrode 102 and the top edge 118T of the second electrode 108, and between the upper side portion 112a of the first electrode 102 and the top edge 124T of the third electrode 110 in response to the change in the electric signal. The presence of the conductive path may reduce the resistance of the resistive layer 106 while the absence of the conductive path may increase the resistance of the resistive layer 106, thereby enabling a controllable resistive nature of the resistive layer 106. The resistive layer 106 may exhibit resistive changing properties characterized by different resistance states of the material forming this layer. These resistance states (e.g., a high resistance state (HRS) or a low resistance state (LRS)) may be used to represent one or more bits of information.

The creation of the acute angle 108T between the top surface 118 of the second electrode 108 and the side 120 of the second electrode 108 may provide a sharp top edge 118T of the second electrode 108. Similarly, the creation of the acute angle 110T between the top surface 124 of the third electrode 110 and the side 126 of the third electrode 110 may provide a sharp top edge 124T of the third electrode 110. A strong localization of electric fields (i.e., the largest concentration of electric charges) can be found at the respective top edges 118T and 124T. With a strong localization of electric fields, the conductive paths formed between the first electrode 102 and the second electrode 108, and between the first electrode 102 and the third electrode 110 can be confined, and do not form randomly along the length of the resistive layer 106. The confinement of the conducting path may help to reduce the stochasticity of its formation, which in turn reduces the cycle-to-cycle and device-to-device variability of the memory devices in the high resistive state. In other words, the variability of the resistance of the resistive layer 106 in the high resistive state may be reduced. This may enable a stable switching of the resistive states in the resistive layer 106 during the operation of the device and may reduce its overall power consumption.

By positioning the spacer element 104 on the lower side portions 112b, 113b of the first electrode 102, the spacer element 104 may electrically isolate the lower side portions 112b, 113b of the first electrode 102 from the resistive layer 106. Accordingly, the conductive path (e.g., a filament) in the resistive layer 106 can be confined within a section of the resistive layer 106 that contacts the upper side portions 112a, 113a of the first electrode 102. The reduced area of contact between the first electrode 102 and the resistive layer 106 may reduce variations in the resistive switching characteristics (i.e., a stable switching of resistive states) during the operation of the device and reduce its power consumption. The resistive layer 106 may be disposed on and may cover the spacer element 104. As shown in FIG. 1, the resistive layer 106 may be laterally between the spacer element 104 and the side 120 of the second electrode 108, and between the spacer element and the side 126 of the third electrode 110. In some embodiments, the resistive layer 106 may be below the bottom surface 122 of the second electrode 108, as well as below the bottom surface 128 of the third electrode 110.

The first electrode 102 may be structured as an active electrode while the second electrode 108 and the third electrode 110 may be structured as inert electrodes. Alternatively, the first electrode 102 may be structured as an inert electrode while the second electrode 108 and the third electrode 110 may be structured as active electrodes. The first electrode 102 may have a thickness in the range of about 10 nm to about 30 nm. The second electrode 108 and the third electrode 110 may each have a thickness in the range of about 5 nm to about 25 nm. The term "thickness" when used to characterize a thickness of an electrode described herein may be measured as a distance between a top surface of the electrode and a bottom surface of the electrode.

As used herein, the term "active electrode" may refer to an electrode having a conductive material that is capable of being oxidized and/or reduced (i.e., redox reactions) to generate electric charges for a formation of a conductive path in the resistive layer 106. Examples of the conductive material in the active electrode may include a metal such as, but not limited to, tantalum (Ta), hafnium (Hf), titanium (Ti), copper (Cu), silver (Ag), cobalt (Co), tungsten (W), or an alloy thereof. Conversely, the term "inert electrode" may refer to a conductive material that is capable of resisting redox reactions. Examples of the conductive material for the inert electrode may include, but are not limited to, ruthenium (Ru), platinum (Pt), titanium nitride (TiN), tantalum nitride (TaN).

The first electrode 102, the second electrode 108, and the third electrode 110 may be connected to various interconnect structures to send or receive electrical signals between other circuitry and/or active components in a memory device. For example, the bottom surface 114 of the first electrode 102 may be disposed upon an interconnect via 132. Interconnect vias 136 may be disposed on the top surface 118 of the second electrode 108 and the top surface 124 of the third electrode 110. The interconnect vias 132, 136 may include a metal such as copper, cobalt, aluminum, or an alloy thereof. The interconnect via 132 may be formed in a first inter-metal dielectric region 130 while the interconnect vias 136 may be formed in a second inter-metal dielectric region 134. Examples of dielectric material in the first inter-metal dielectric region 130 and the second inter-metal dielectric region 134 may include, but are not limited to, silicon dioxide, tetraethyl orthosilicate (TEOS), or a material having a chemical composition of $SiC_xO_yH_z$, wherein x, y, and z are in stoichiometric ratio.

Examples of the active components (not shown) that may be connected to the electrodes 102, 108, 110 may include diodes (e.g., a bi-directional diode, a single-photon avalanche diode, etc.) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

The memory device described herein may be a resistive memory device. Examples of the resistive memory device may include, but are not limited to, oxide random-access memory (OxRAM) or conductive bridge random-access memory (CBRAM).

FIGS. 2 through 7 show a set of steps that may be used to create the memory devices as provided for in embodiments of the present disclosure.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 2:
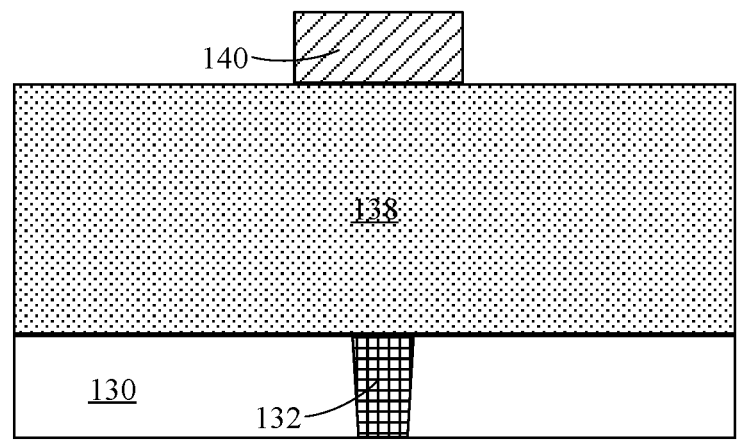
FIG. 2 through FIG. 7 are cross-sectional views depicting a set of steps for fabricating an exemplary memory device.

Referring to FIG. 2, a first inter-metal dielectric region 130 may be formed above active components of an integrated circuit chip (e.g., in a back end of line portion). For example, the first inter-metal dielectric region 130 may be formed above a substrate (not shown). Interconnect via 132 may be formed in the first inter-metal dielectric region 130. A first conductive material layer 138 may be formed on the first inter-metal dielectric region 130, for example, using deposition techniques described herein.

A mask layer 140 may be formed on the conductive material layer 138. The mask layer 140 may be deposited on the conductive material layer 138 using the deposition techniques described herein. The deposited mask layer 140 may additionally be patterned using the patterning techniques described herein. As shown, a portion of the conductive material layer 138 may be covered by the mask layer 140 while the remaining portion of the conductive material layer 138 may be uncovered by the mask layer 140.

Figure 3:
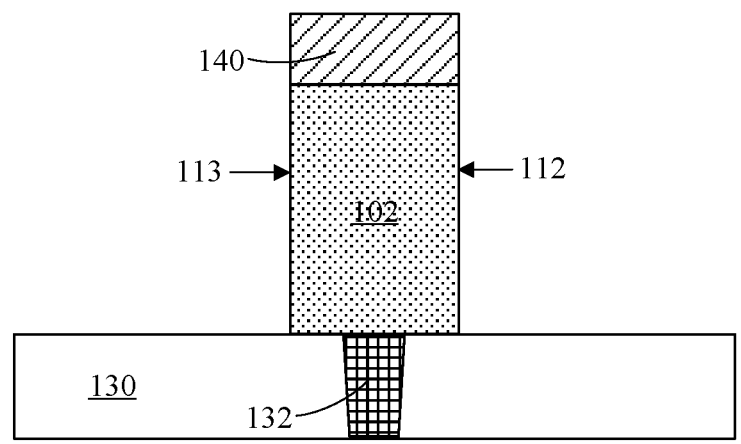

Referring to FIG. 3, the conductive material layer 138 may be patterned using the patterning techniques described herein to form the first electrode 102. In particular, the portion of the conductive material layer 138 that is uncovered by the mask layer 140 may be etched using an etching process. The first electrode 102 may be formed to have at least one side (e.g., a first side 113 and a second side 112). The patterning of the conductive material layer 138 may also expose parts of the underlying inter-metal dielectric region 130.

Figure 4:
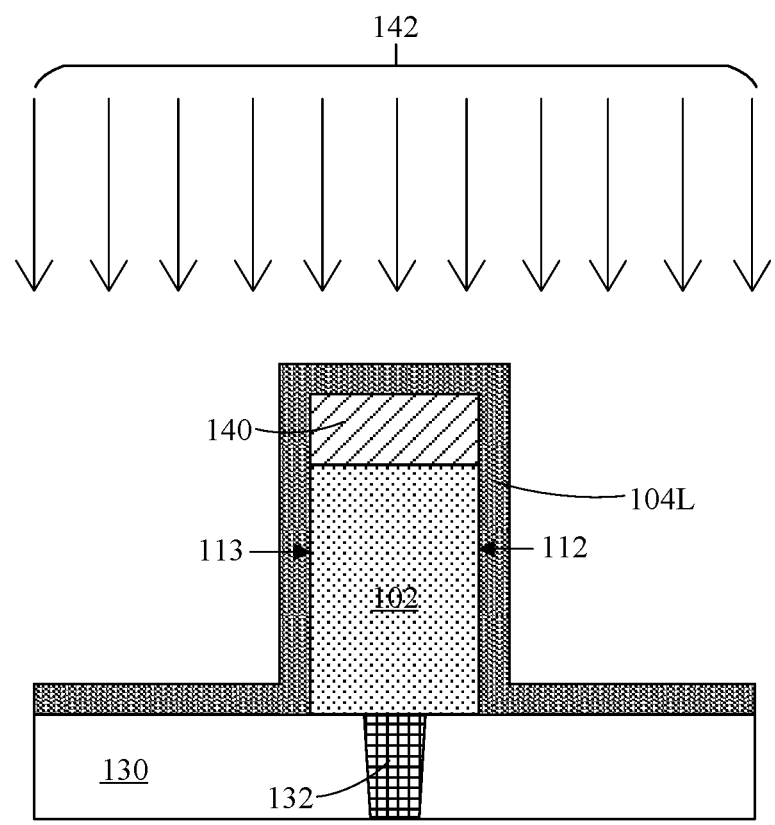

Referring to FIG. 4, a spacer element layer 104L may be formed on the mask layer 140, the sides 112, 113 of the first electrode 102, and the first inter-metal dielectric region 130. For example, the spacer element layer 104L may be formed using the deposition techniques described herein, or preferably, using a conformal deposition process such as an ALD process or a highly conformal CVD process. As used herein, the term "conformal" refers to a deposition technique in which the deposited material conforms to the contours of the surface or structure being deposited on. The conformal deposition process may provide the spacer element layer 104L with a uniform thickness. The deposited spacer element layer 104L may be subsequently subjected to an etching process 142. The etching process 142 may include an anisotropic etch or a directional etching technique, and may etch the spacer element layer 104L in a vertical direction.

The mask layer 140 may include a nitride or an oxide. Examples of a nitride may include, but are not limited to, silicon nitride, silicon oxynitride. Examples of an oxide may include, but are not limited to, silicon dioxide, tetraethyl orthosilicate (TEOS), or a material having a chemical composition of $SiC_xO_yH_z$, wherein x, y, and z are in stoichiometric ratio. The mask layer 140 may be of a different material from the spacer element layer 104L. In particular, the mask layer 140 and the spacer element layer 104L may have different etch selectivity and relative etch rates. The differences in the etch selectivity and relative etch rates of the mask layer 140 and the spacer element layer 104L may minimize the loss of material in the mask layer 140 during the etching process 142. For example, the etching process 142 may be highly selective to the material in the spacer element layer 104L as compared to the material in the mask layer 140.

Figure 5:
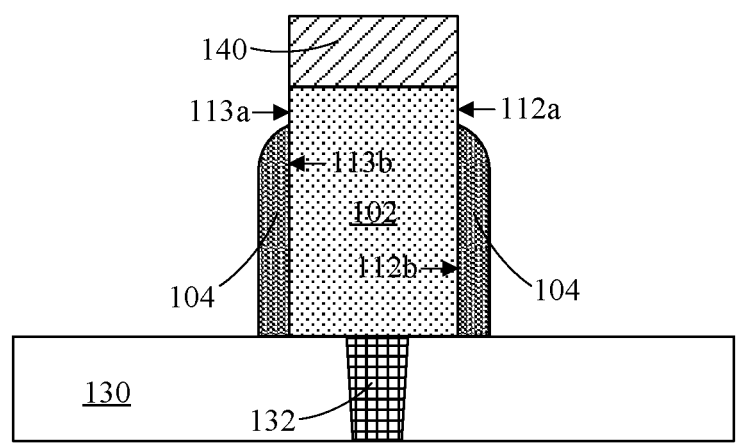

Referring to FIG. 5, the spacer element layer 104L may be etched to form the spacer element 104. The etching of the spacer element layer 104L may expose the upper portions 112a, 113a of the sides 112, 113. The spacer element 104 may be formed on the lower portions 112b, 113b of the sides 112, 113. The etching process 142 described in FIG. 4 may also remove portions of the spacer element layer 104L deposited on the mask layer 140 and the first inter-metal dielectric region 130.

Figure 6:
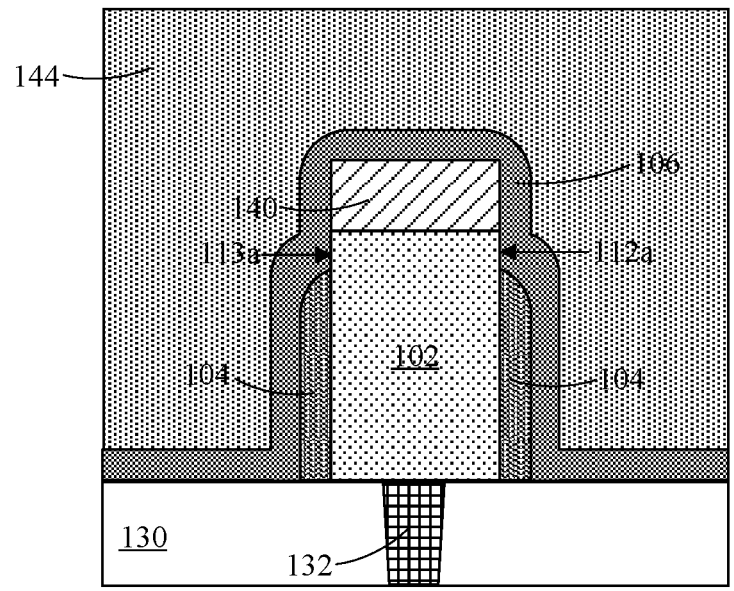

Referring to FIG. 6, a resistive layer 106 may be formed on the upper side portions 112a, 113a of the first electrode 102 using a conformal deposition process, such as an ALD process or a highly conformal CVD process. The deposited resistive layer 106 may also conform to the mask layer 140, the spacer element 104, the first inter-metal dielectric region 130. A second conductive material layer 144 may be formed on the resistive layer 106 using the deposition techniques described herein. The second conductive material layer 144 may be of a different material from the material in the first electrode 102.

Figure 7:
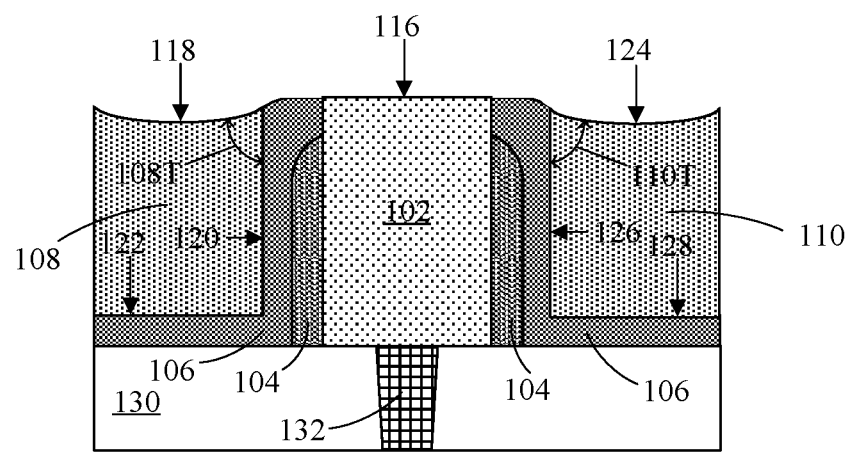

Referring to FIG. 7, a chemical mechanical planarization (CMP) process may be performed to remove materials from the second conductive material layer 144 and the resistive layer 106. The CMP process also completely removes the mask layer 140 and exposes the top surface 116 of the first electrode 102. The CMP process may be stopped upon exposing the top surface 116 of the first electrode 102. The mask layer 140 may serve as a protection for the first electrode 102 by preventing the loss of material on the top surface 116 of the first electrode 102 during the CMP process. The top surface 116 of the first electrode 102 may have a substantially planar profile after the CMP process.

The CMP process performed on the second conductive material layer 144 may form the second electrode 108 and the third electrode 110. Additionally, the CMP process may form concave profiles on the top surface 118 of the second electrode 108 and the top surface 124 of the third electrode 110. As shown in FIG. 7, the second electrode 108 has a side 120 that forms an acute angle 108T with the concave top surface 118. Likewise, the third electrode 110 has a side 126 that forms an acute angle 110T with the concave top surface 124. The resistive layer 106 may be between the spacer element 104 and the side 120 of the second electrode 108, and between the spacer element 104 and the side 126 of the third electrode 110. The resistive layer 106 may also be below the bottom surface 122 of the second electrode 108 and below the bottom surface 128 of the third electrode 110. In an embodiment, the second electrode 108 and the third electrode 110 may be formed on the resistive layer 106.

Subsequently, the structure shown in FIG. 7 may undergo further processing to form the structure described in FIG. 1. For example, a second inter-metal dielectric region may be formed over the structure shown in FIG. 7, followed by patterning the material in the second inter-metal dielectric region to provide openings for the formation of interconnect vias. The interconnect vias may be formed by a damascene process, in which the interconnect vias contact the top surface 118 of the second electrode 108 and the top surface 124 of the third electrode 110.

FIG. 8 through FIG. 12 show another set of steps, subsequent to FIG. 5, that may be used to create the memory devices as provided for in embodiments of the present disclosure.

Figure 8:
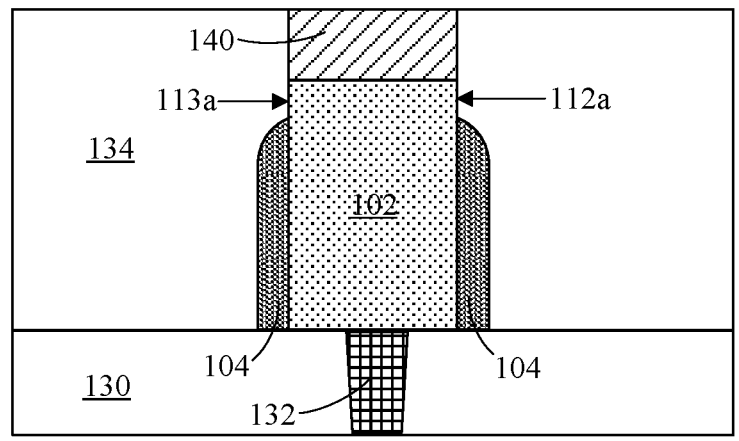
FIG. 8 through FIG. 12 are cross-sectional views depicting structures at stages subsequent to FIG. 5 for fabricating another exemplary memory device.

Referring to FIG. 8 (FIG. 8 continues from the structure shown in FIG. 5), a second inter-metal dielectric region 134 may be formed by deposition of a dielectric material over the structure shown in FIG. 5. The second inter-metal dielectric region 134 may be formed on the first inter-metal dielectric region 130, the spacer element 104, the upper side portions 112a, 113a of the first electrode 102, and the mask layer 140.

Figure 9:
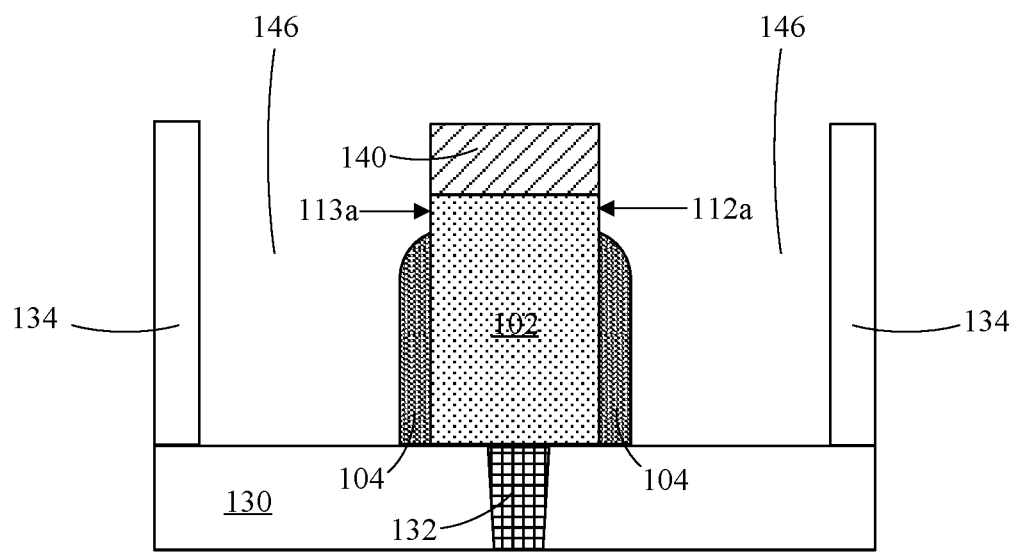

Referring to FIG. 9, the dielectric material in the second inter-metal dielectric region 134 may be patterned, using the patterning techniques described herein, to form openings 146 defined in the second inter-metal dielectric region 134. A mask may be used to define the openings 146. The openings 146 may be laterally adjacent to the spacer element 104, the first electrode 102, and the mask layer 140. The dielectric material in the second inter-metal dielectric region 134 may be of a different material from the spacer element layer 104L and the mask layer 140. For example, the dielectric material in the second inter-metal dielectric region 134 may have different etch selectivity and relative etch rates as compared to the mask layer 140 and the spacer element 104. For example, the patterning of the second inter-metal dielectric region 134 may include an etching process that is highly selective to the material in the second inter-metal dielectric region 134 as compared to the respective material in the spacer element 104 and the mask layer 140. The differences in the etch selectivity may minimize the loss of material in the mask layer 140 and the spacer element 104 during the etching of the second inter-metal dielectric region 134.

Figure 10:
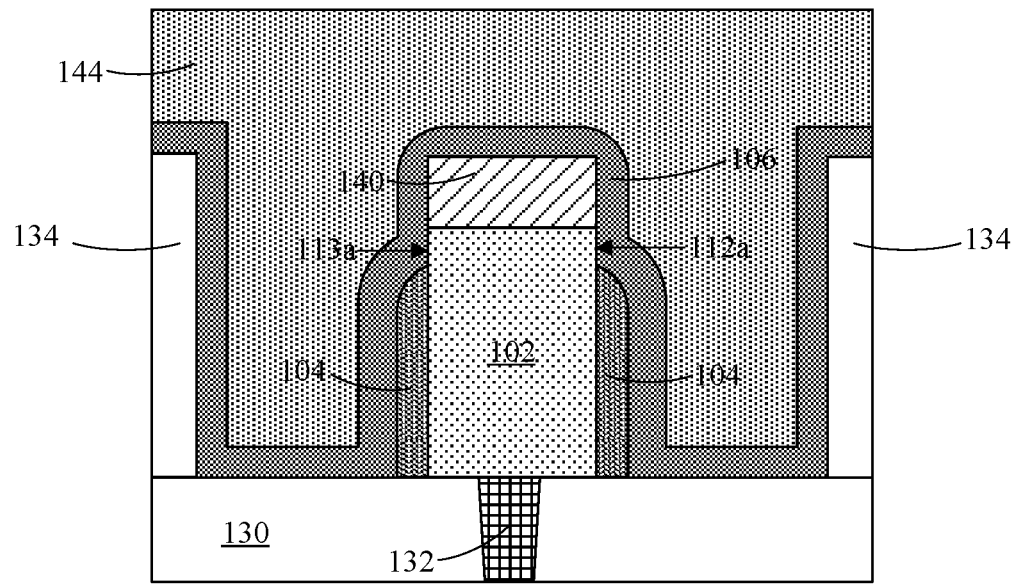

Referring to FIG. 10, a resistive layer 106 may be formed in the openings 146 and on the upper side portions 112a, 113a of the first electrode 102 using a conformal deposition process, such as an ALD process or a highly conformal CVD process. The deposited resistive layer 106 may also conform to the mask layer 140, the spacer element 104, the first inter-metal dielectric region 130. A second conductive material layer 144 may be formed on the resistive layer 106 using the deposition techniques described herein. The second conductive material layer 144 may be of a different material from the material in the first electrode 102.

Figure 11:
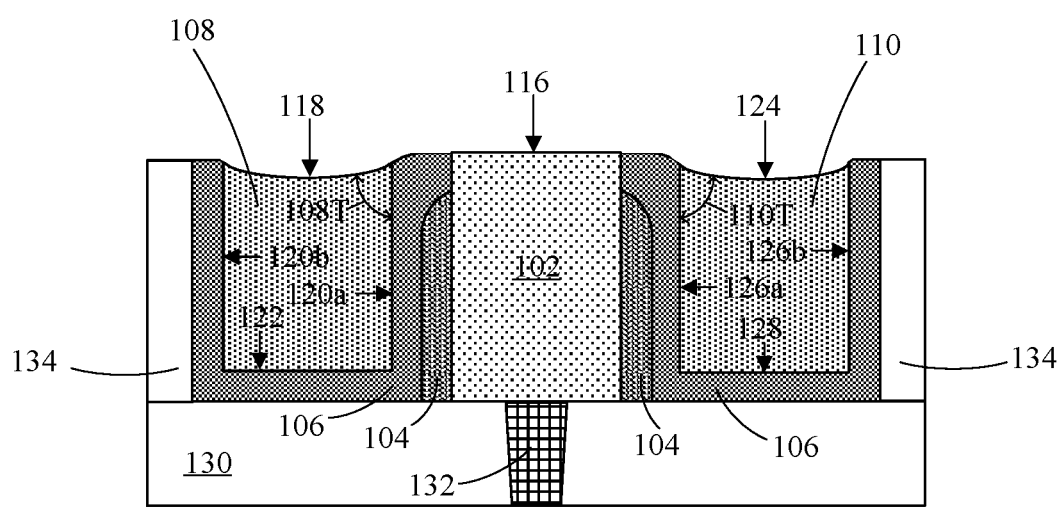

Referring to FIG. 11, a CMP process may be performed to remove materials from the second conductive material layer 144 and the resistive layer 106. The CMP process also completely removes the mask layer 140 and exposes the top surface 116 of the first electrode 102. The CMP process may be stopped upon exposing the top surface 116 of the first electrode 102. The mask layer 140 may serve as a protection for the first electrode 102 by preventing the loss of material on the top surface 116 of the first electrode 102 during the CMP process. The top surface 116 of the first electrode 102 may have a substantially planar profile after the CMP process.

The CMP process performed on the second conductive material layer 144 may form the second electrode 108 and the third electrode 110. Additionally, the CMP process may form concave profiles on the top surface 118 of the second electrode 108 and the top surface 124 of the third electrode 110. As shown in FIG. 11, the second electrode 108 may have a first side 120a and a second side 120b. The sides 120a, 120b of the second electrode 108 may form an acute angle 108T with the concave top surface 118 of the second electrode 108. Likewise, the third electrode 110 may have a first side 126a and a second side 126b. The sides 126a, 126b of the third electrode 110 may form an acute angle 110T with the concave top surface 124 of the third electrode 110. The resistive layer 106 may be between the spacer element 104 and the first side 120a of the second electrode 108, and between the spacer element 104 and the first side 126a of the third electrode 110. The resistive layer 106 may also be below the bottom surface 122 of the second electrode 108 and below the bottom surface 128 of the third electrode 110. The resistive layer 106 may also extend to lie on the second side 120b of the second electrode 108 and the second side 126b of the third electrode 110. In an embodiment, the second electrode 108 and the third electrode 110 may be formed on the resistive layer 106.

Figure 12:
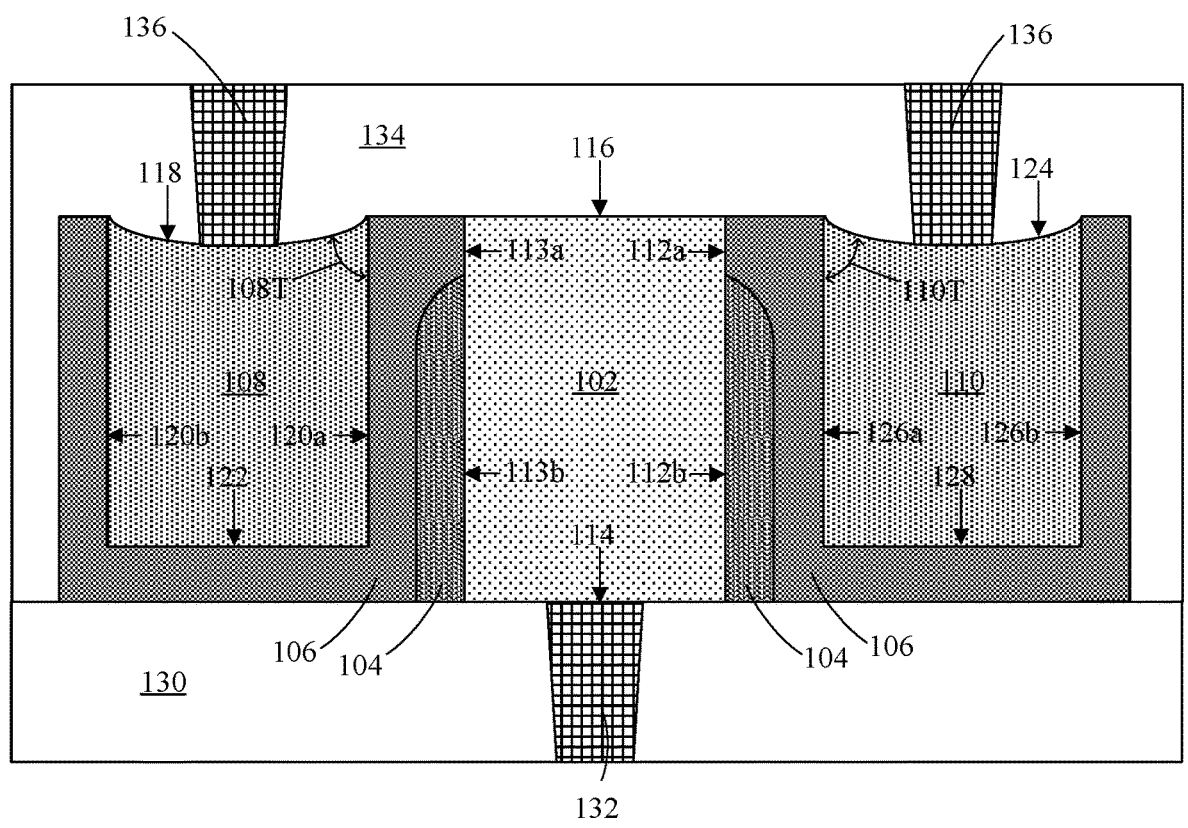

Referring to FIG. 12, another example of a memory device is shown. Interconnect vias 136 may be formed on the top surface 118 of the second electrode 108 and the top surface 124 of the third electrode 110. For example, an additional dielectric material may be deposited over the structure shown in FIG. 11, followed by patterning the material in the second inter-metal dielectric region 134 to provide openings (not shown) for the formation of the interconnect vias 136. The interconnect vias 136 may be formed by a damascene process.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   a first electrode having a side, the side has upper and lower portions;
   a spacer element directly on the lower portion of the side of the first electrode;
   a resistive layer directly on the upper portion of the side of the first electrode; and
   a second electrode laterally adjacent to the side of the first electrode, the second electrode having a top surface, a bottom surface, and a first side, wherein the top surface of the second electrode has a concave profile, and wherein the bottom surface and the first side of the second electrode is directly on the resistive layer.

2. The device of claim 1, wherein the first side of the second electrode forms an acute angle with the concave top surface of the second electrode.

3. The device of claim 2, wherein the first side of the second electrode meets the top surface of the second electrode to provide a top edge of the second electrode.

4. The device of claim 3, wherein the resistive layer and the spacer element are between the first electrode and the second electrode.

5. The device of claim 4, wherein the resistive layer covers the spacer element.

6. The device of claim 5, wherein the spacer element isolates the lower portion of the side of the first electrode from the resistive layer.

7. The device of claim 6, wherein the resistive layer is laterally between the spacer element and the first side of the second electrode.

8. The device of claim 1, wherein the resistive layer is below the bottom surface of the second electrode.

9. The device of claim 8, wherein the second electrode has a second side, and the resistive layer extends to lie on the second side of the second electrode.

10. The device of claim 1, wherein the first electrode has a top surface, the top surface of the first electrode has a substantially planar profile.

11. The device of claim 10, wherein the top surface of the first electrode is uncovered by the resistive layer.

12. The device of claim 1, further comprising a third electrode laterally adjacent to the first electrode, wherein the first electrode is laterally between the third electrode and the second electrode.

13. The device of claim 12, wherein the third electrode has a top surface, and the top surface has a concave profile.

14. The device of claim 12, wherein the resistive layer and the spacer element lie between the first electrode and the third electrode.

15. The device of claim 12, wherein the third electrode has a bottom surface, and the resistive layer is below the bottom surface of the third electrode.

16. A method of forming a memory device comprising:
    forming a first electrode having a side with upper and lower portions, the first electrode being formed above an inter-metal dielectric region;
    forming a spacer element directly on the lower portion of the side of the first electrode;
    forming a resistive layer directly on the upper portion of the side of the first electrode; and
    forming a second electrode laterally adjacent to the side of the first electrode, the second electrode having a top surface, a bottom surface, and a first side, wherein the top surface of the second electrode has a concave profile, and wherein the bottom surface and the first side of the second electrode being formed directly on the resistive layer.

17. The method of claim 16, wherein the forming of the spacer element includes depositing of a spacer element layer on the side of the first electrode, and etching the spacer element layer to expose the upper portion of the side of the first electrode.

18. The method of claim 16, wherein the forming of the resistive layer includes conformal deposition of the resistive layer on the upper portion of the side of the first electrode and on the spacer element.

19. The method of claim 16, wherein the forming of the second electrode includes performing a chemical mechanical planarization (CMP) process.

* * * * *